United States Patent [19]

Noordanus et al.

[11] 3,956,703
[45] May 11, 1976

[54] MULTICHANNEL GENERATOR

[75] Inventors: Johannes Noordanus; Marie Marcel Arnold Antoine Ghislain Verstraelen, both of Hilversum, Netherlands

[73] Assignee: U.S. Philips Corporation, New York, N.Y.

[22] Filed: Apr. 7, 1975

[21] Appl. No.: 565,851

[30] Foreign Application Priority Data
Apr. 22, 1974 Netherlands ............... 7405404

[52] U.S. Cl. ............................ 328/14; 328/61; 331/1 A; 331/25
[51] Int. Cl.² .................................... H03B 19/00
[58] Field of Search ........... 328/14, 61; 331/1 A, 331/25

[56] References Cited
UNITED STATES PATENTS

| | | | |
|---|---|---|---|
| 3,331,035 | 7/1967 | Strickholm | 328/14 X |
| 3,665,323 | 5/1972 | Peterson | 328/14 |
| 3,701,027 | 10/1972 | Belton | 328/14 X |
| 3,702,441 | 11/1972 | Thrower | 328/14 |

*Primary Examiner*—John S. Heyman
*Attorney, Agent, or Firm*—Frank R. Trifari; George B. Berka

[57] ABSTRACT

Multichannel generator for at will generating any one of a plurality of channel frequencies in the GHz band which are spaced from one another by equal channel distances. The multichannel generator is constituted by a frequency synthesis device which comprises two phase-locked loops which each comprise an oscillator, a divider adjustable in discrete steps and a phase detector to which a reference frequency is applied. The adjustable dividers keep in step. One of the oscillators is coupled via a fixed divider and a mixer stage to the adjustable frequency divider included in the relevant loop. The signal injected into the mixer stage is derived from the other oscillator. The influence of the fixed divider on the value of the channel spacing is avoided by a particular relationship between the reference frequencies supplied to the phase detectors.

4 Claims, 6 Drawing Figures

MULTICHANNEL GENERATOR

The invention relates to a multichannel generator constituted by a frequency synthesizer for producing an output signal variable through a plurality of channel frequencies spaced by uniform frequency steps, said frequency synthesizer comprising a frequency adjustable circuit section with a voltage-controlled oscillator (VCO), a frequency divider adjustable in incremental steps and a standard frequency source connected to said frequency adjustable circuit section.

Multichannel generators of the aforementioned type are known. More particularly the frequency-adjustable circuit section thereof takes the form of a phase-locked loop. In its most simple form such a phase-locked loop comprises, as FIG. 1 shows, a voltage-controlled oscillator 1, a load 3 connected to the oscillator output 2, and a frequency divider 4 which also is connected to the said oscillator output and is adjustable in incremental steps. The output frequency of this adjustable frequency divider is compared in a phase detector 5 with a fixed reference frequency $f_r$ from a standard frequency source 6 so as to produce a control signal which through a low-pass filter 7 is applied to a control input 8 of the voltage-controlled oscillator 1, the oscillator frequency thus being locked to a frequency $N.f_r$, where N = the division factor of the adjustable frequency divider and $f_r$ = the reference frequency. In such a phase-locked loop the channel spacing is known to be equal to the reference frequency $f_r$. Hence, in order to obtain a small channel spacing the reference frequency $f_r$ must be low. However, a low reference frequency $f_r$ has the disadvantage that the speed of the loop will be low, for the speed of the loop is dependent on the cut-off frequency of the loop which for reasons of stability is mainly determined by the low-pass filter 6 included in the loop to suppress undesirable modulation of the oscillator by the reference frequency $f_r$. From this it follows that the requirement of a comparatively small channel spacing and a consequent low reference frequency $f_r$ conflicts with the requirement of a short acquisition time and consequent high loop speed.

Figure 1:
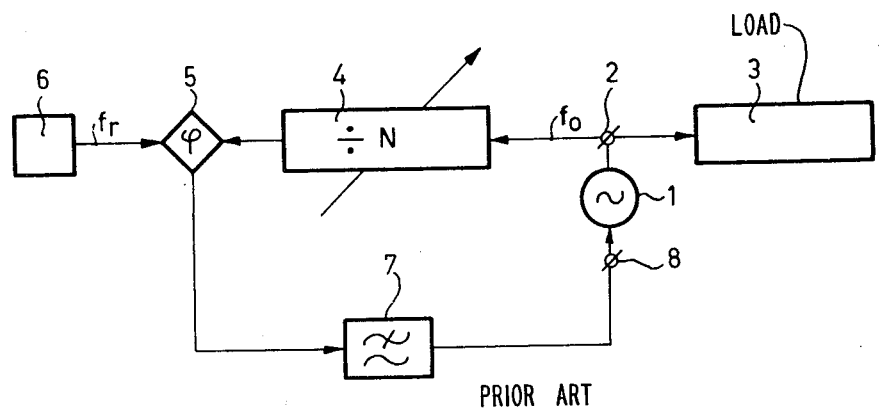
FIGS. 1—3 shows various prior art examples that fail to achieve the advantages gained by the invention herein.

Another difficulty arises when comparatively high channel frequencies are desired. For example, the phase-locked loop shown in FIG. 1 cannot simply be used if the output frequency of the oscillator 1 is comparatively high, for example, higher than 100 MHz. In this case a high oscillator output frequency must first be translated to a lower frequency, because the maximum permissible input frequency for the adjustable frequency divider 4 included in the loop is restricted by the comparatively low speed of the digital basic circuits suitable for realising such an adjustable frequency divider in practice.

Figure 2:
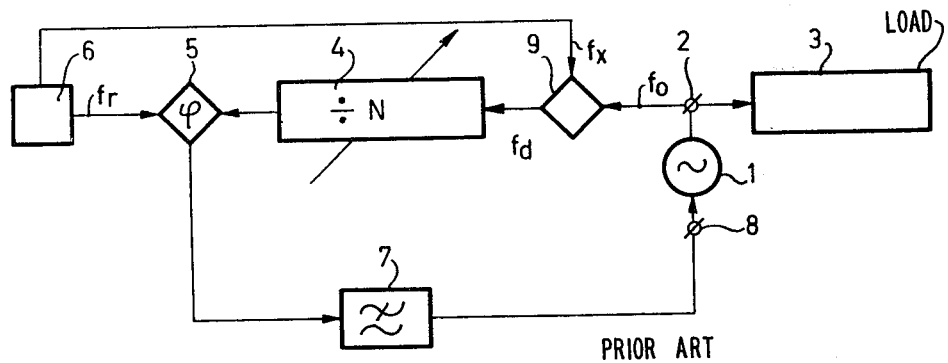

In order to convert the comparatively high oscillator output frequency to an input frequency suitable for the adjustable frequency divider it is known to connect, as is shown in FIG. 2, between the oscillator output 2 and the input of the adjustable frequency divider 4 a mixer stage 9 in which the oscillator output frequency $f_o$ is transposed by means of an auxiliary signal of frequency $f_x$ derived from the reference source 6 to, for example, a frequency $f_d = f_x - f_o$.

With this method of frequency translation the required loop speed is generally not affected, however, several disadvantages occur. For example, the voltage-controlled oscillator 1 may be synchronized to an undesired frequency, because not only the difference frequency but also the sum frequency appears at the output of the mixer stage. This restricts the tuning range of the voltage-controlled oscillator or the minimum value of the difference frequency $f_d$. In addition, usually a special search circuit is required, because in most cases the output signal of the phase detector will be attenuated by the low-pass filter to an extent such that the pull-in range of the loop becomes inadmissibly small. However, the use of a special search circuit is to be avoided, because its operation is time consuming, which is incompatible with the requirement of a short acquisition time.

Another serious disadvantage consists in that due to the direct transposition of the tuning range of the oscillator, the frequency $f_d$ applied to the adjustable frequency divider 4 will vary over a comparatively large frequency range, which gives rise to a comparatively large variation of the loop gain over the entire tuning range.

Figure 3:
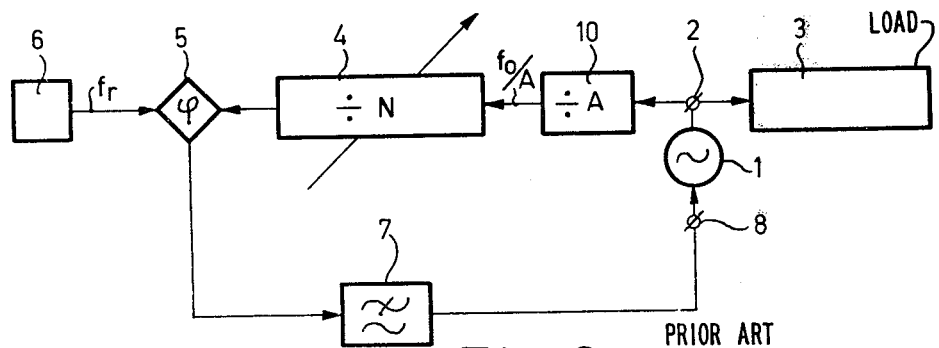

Another known possibility of decreasing the input frequency of the adjustable frequency divider is shown in FIG. 3. In this configuration of the phase-locked loop a fixed frequency divider 10 is connected between the oscillator output 2 and the input of the adjustable frequency divider 4. As the digital basic circuits for practical implementation of fixed frequency dividers are must simpler than those of adjustable frequency dividers, such fixed frequency dividers can be realised for high input frequencies. As compared to the use of a mixer stage as a frequency translation device, the use of a fixed frequency divider has the advantage that the relative division ratio remains constant and that, moreover, no additional transposition signal of frequency $f_x$ is required. However, the use of a fixed frequency divider as the frequency translation device in such a phase-locked loop has the serious disadvantage that the relative channel spacing is considerably increased, because it is equal to $A.f_r$, where A is the division factor of the fixed frequency divider 10 and $f_r$ is the reference frequency. Obviously, in order to make the channel spacing equal to the reference frequency $f_r$, the reference frequency applied to the phase detector 5 may be made equal to a frequency $f_r/A$, where A again is the division factor of the fixed frequency divider 10. However, as a result the loop speed will then be reduced by the factor A, because the low-pass filter then is required to be capable of suppressing the frequency $f_r/A$. Hence this obvious step is in conflict with the requirement of a short acquisition time.

However, for the greater part of the practical uses a compromise solution is possible, because usually the frequency band in which the multichannel generators are employed is not very high, for example does not exceed a few hundreds of MHz.

In practice, more particularly for use in, for example, modern mobile automatic telephony systems, however, multichannel generators are required which in addition to having small channel spacing and short acquisition time are capable of operating in much higher frequency bands, for example of 1 GHz and higher, than the conventional types.

Hence it is an object of the present invention to provide a multichannel generator of the aforementioned type including a frequency translation device connected between the oscillator output and the input of the adjustable frequency divider, and which is particularly suitable for generating, in a high-frequency band, a comparatively large number of channel frequencies having equal, relatively small channel spacings and which, in spite of the ensueing conflicting requirements, has a high loop speed and hence a short acquisition time.

According to the invention such a multichannel generator is characterized in that the said frequency translation device comprises a frequency divider of fixed division factor A whose input is connected to the output of the first voltage-controlled oscillator and a mixer stage included between the output of the said fixed frequency divider and the input of the said first adjustable frequency divider, and in that said frequency synthesis device further comprises a second frequency-adjustable circuit section for generating a transposition signal applied to the said mixer stage and including a second voltage-controlled oscillator, a second frequency divider adjustable in incremental steps, with the frequency incremental steps of said first and second adjustable frequency dividers being of equal step values and a second standard frequency source connected to said second frequency-adjustable circuit section with the frequency of said second standard frequency source and the frequency of said first standard frequency source separated by a frequency value quantatively equal to the frequency of one of said first and second standard frequency sources divided by said division factor A of said fixed frequency divider, an output signal connection for said output signal from said first frequency adjustable circuit section, whereby said frequency synthesizer is adjustable through a range of frequency output steps appearing at said output connection, and with frequency output steps each uniformly equal in frequency value to the frequency used in expressing the frequency difference between said first and second standard frequency sources in response to simultaneous minimum stepping of said first and second adjustable frequency dividers.

The invention and its advantages will now be described more fully with reference to FIGS. 4, 5 and 6.

Figure 4:
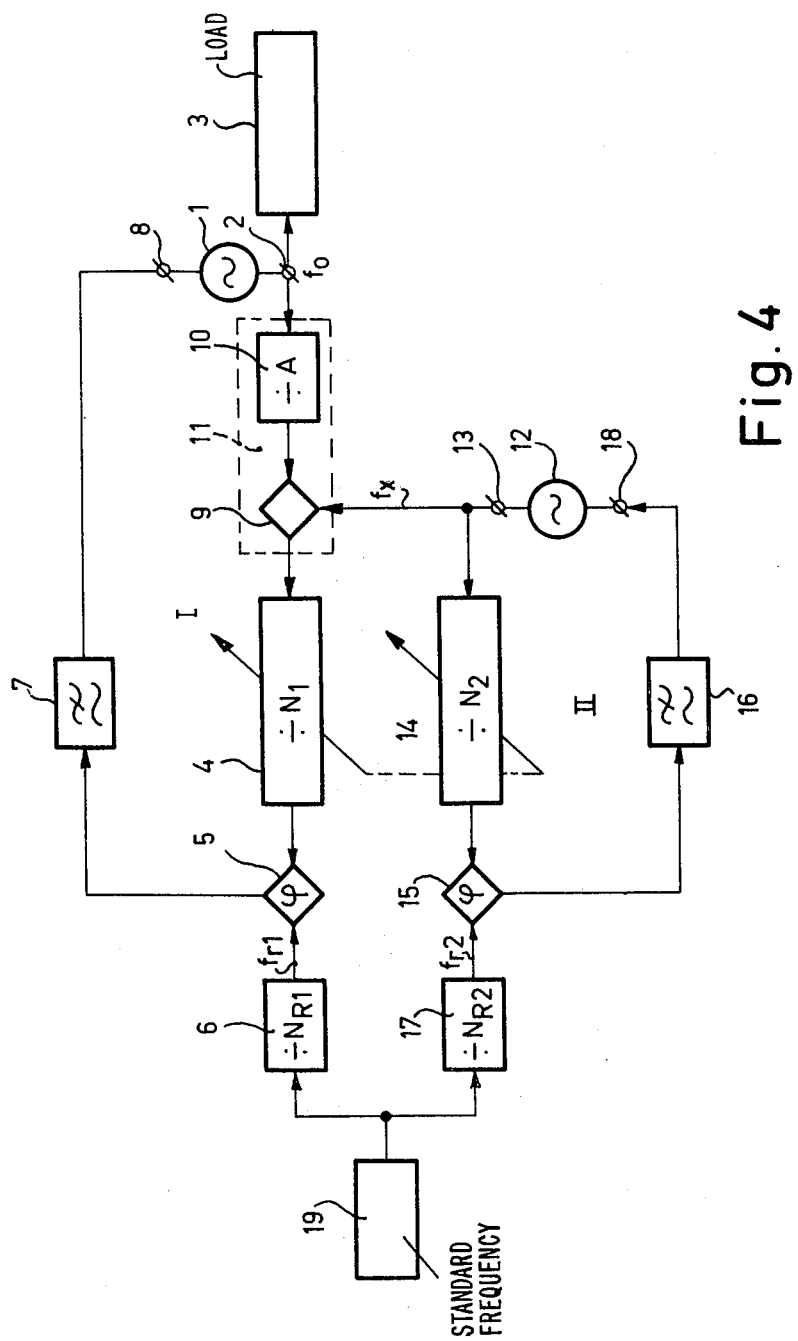
FIG. 4 is a circuit diagram showing schematically the basic elements of a multichannel generator according to the invention.

In FIG. 4 reference numeral I denotes a first frequency adjustable circuit section in the form of a phase-locked loop of a frequency synthesizer constituting a multichannel generator. The loop comprises in sequence a voltage-controlled oscillator 1, a frequency translation device 11, a frequency divider 4 adjustable in incremental steps, a phase detector 5 and a low-pass filter 7. To said phase detector 5 the signal derived from the output of the adjustable frequency divider 4 and also a signal of fixed reference frequency $f_{r1}$ derived from a standard frequency source 6 are applied to produce a control signal which through said low-pass filter 7 is applied to the control input 8 of oscillator 1.

According to the invention a frequency synthesizer which is highly suitable, in particular, for comparatively very high frequencies is obtained, if the said frequency translation device 11 comprises a frequency divider 10 of fixed division factor A which is connected to the input 2 of the voltage-controlled oscillator 1 and a mixer stage 9 included between the output of the said fixed frequency divider 10 and the input of said adjustable frequency divider 4, and if the frequency synthesis device is further provided with a second frequency adjustable circuit section for generating a transposition signal of frequency $f_x$ for injection into the mixer stage 9. This second frequency adjustable circuit section, which is also constituted by a phase-locked loop II, comprises in sequence a second voltage-controlled oscillator 12, a second frequency divider 14 adjustable in incremental steps which is connected to the oscillator output 13, a phase detector 15 and a low-pass filter 16.

To the phase detector 15 the output signal from the frequency divider 14 and also a signal of fixed reference frequency $f_{r2}$ derived from a second standard frequency source 17 are applied to produce a control signal which through said low-pass filter 16 is applied to the control input 18 of oscillator 12.

In the embodiment shown the said first and second standard frequency sources 6 and 17 respectively are formed by two frequency dividers having fixed division factors $N_{R1}$ and $N_{R2}$ respectively connected to a common standard frequency source 19.

With regard to the frequency dividers 4 and 14 which are adjustable in incremental steps it should be noted that they are each provided with adjusting means for selecting the division factors which may be desired at a particular instant, for example $N_1$ and $N_2$ respectively. The said adjusting means are coupled to said two dividers 4 and 14 in a manner such that they keep in step over their entire adjustment range, which is symbolically indicated in the figure by arrows joined by a broken line.

The described frequency synthesizer composed of two phase-locked loops according to the invention has the important property that the channel frequency spacing is equal to:

$$\Delta f = A(f_{r1} - f_{r2}) \qquad (1)$$

where: A is the division factor of the fixed divider 10 and $f_{r1}$ and $f_{r2}$ represent the reference frequencies applied to the phase detectors 5 and 15 respectively. Making use of this property it appears that the influence of the fixed divider 10 (division factor A) on the value of the channel frequency spacing $\Delta f$ can be entirely avoided without the required additional measures adversely affecting the loop speed of the loop I. If, for instance, the desired mutual frequency spacing is assumed to be:

$$\Delta f = f \qquad (2)$$

one of the reference frequencies, for instance the reference frequency $f_{r2}$ applied to the phase detector 15 may be:

$$f_{r2} = f_r \qquad (3)$$

provided the other reference frequency, in this case reference frequency $f_{r1}$ applied to the phase detector 5 is:

$$f_{r1} = \frac{A+1}{A} \cdot f_r \qquad (4)$$

where A is the division factor of the fixed divider 10.

For, if the values of $f_{r1}$ and $f_{r2}$ given in the equations (3) and (4) are substituted in the equation (1), then:

$$\Delta f = A(f_{r1} - f_{r2}) = A \left(\frac{A+1}{A}\right) f_r = |f_r|$$

Since the value of $f_{r2}$ is equal to $f_r$, the signal of frequency $f_x$ injected into the mixer stage 9 for every step of the adjustable frequency divider 14 to a next factor of division $N_2$ will take a frequency step $f_r$ which is equal to the channel frequency step which appears at the oscillator output 2. As a result, the relative division ratio remains constant and, provided that the factor-of-division range is not excessive, only a slight change in the loop amplification is produced over the entire tuning range of the oscillator 1.

Figure 5:
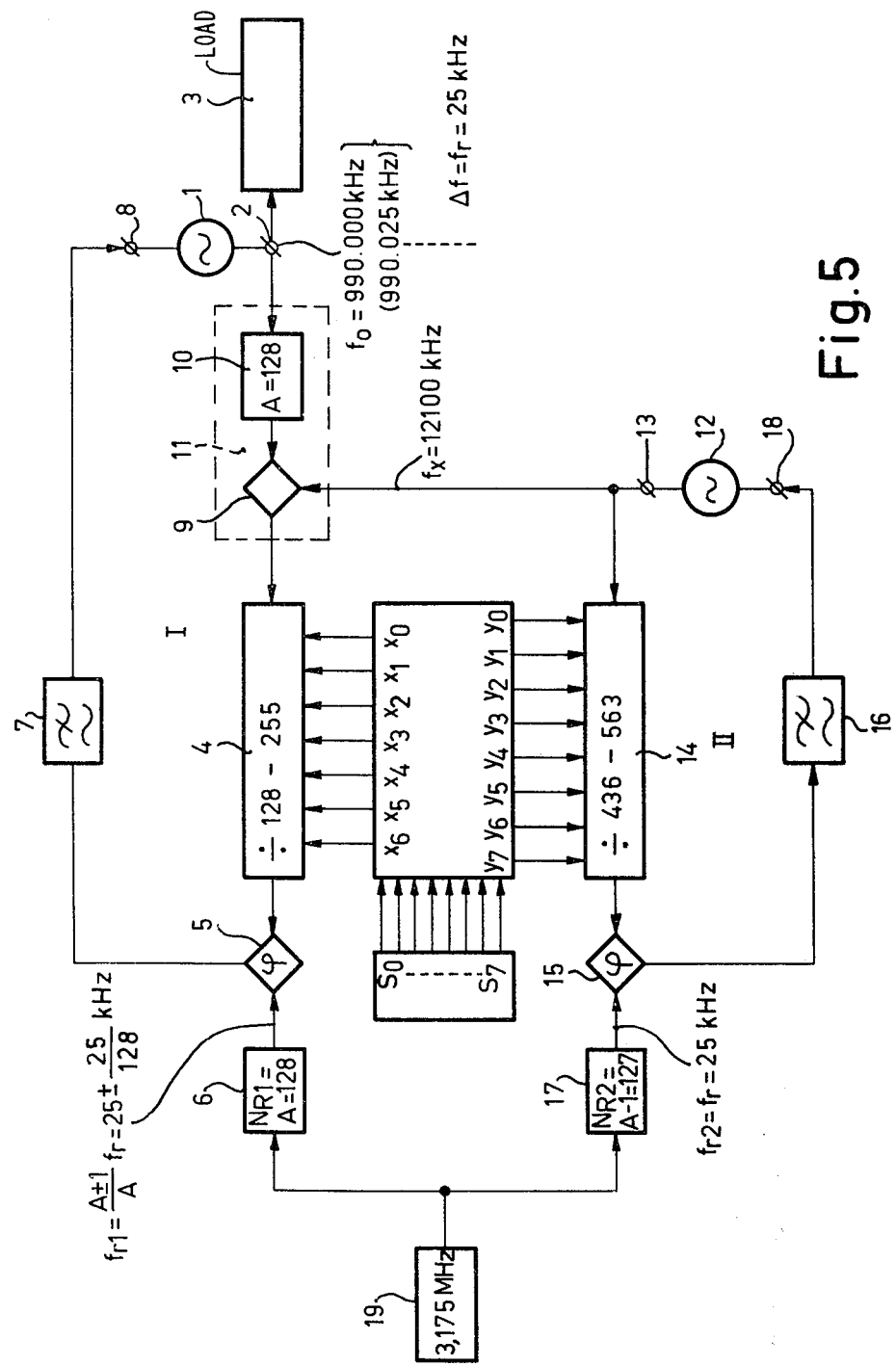
FIG. 5 is a block-schematic diagram of a possible embodiment of the multichannel generator according to the invention.

FIG. 5 shows the multichannel generator of FIG. 4 in a slightly more detailed form, and the frequency values used in a practical embodiment. Component parts which correspond to those of the preceding figures are designated by the same reference numerals in FIG. 5.

The frequency-synthesis device of FIG. 5 is designed for supplying a lowest channel frequency of 990,000 kHz and is adapted to be tuned to 200 higher channel frequencies in steps of $f_r = 25$ kHz. In the practical embodiment of the device shown the following values are used. The fixed divider 10 has a division factor $A = 128$. The standard frequency source 19 produces an output signal at a frequency of $$(A-1) \cdot f_r = 127 \times 25 = 3.175 \text{ MHz}$$

The fixed divider 17 has a division factor $N_{R2} = A - 1 = 127$ and produces the reference frequency $$f_{r2} = \frac{3.175}{127} = 25 \text{ kHz}.$$

The fixed divider 6 has a division factor $N_{R1} = A = 128$ and produces the reference frequency:

$$f_{r1} = \frac{A-1}{A} \cdot f_r = \frac{127}{128} \cdot 25 \text{ kHz}.$$

The frequency dividers 4 and 14 which are adjustable in incremental steps are adjusted by means of a channel selection device 20 by means of which at will any one of the two hundred channel frequencies can be selected. This channel selection device, which hereinafter will be described more fully, provides a binary number of 8 bits ($s_0, s_1, s_2, \ldots, s_7$), which is representative of the channel selected, to a number conversion device 21 which is built up of logic elements and converts the received binary number into two mutually different binary numbers of 8 bits each ($x_0, x_1, x_2, \ldots, x_7$) and ($y_0, y_1, y_2, \ldots, y_7$) which are applied to the frequency dividers 4 and 14 respectively for adjusting the division factors $N_1$ and $N_2$ respectively. The divider 4 is adjustable in 127 unitary incremental steps from a division factor 128 to a division factor 255. The divider 14 is adjustable in 127 unitary incremental steps from a division factor 436 to a division factor 563.

On selection of the channel No. 1 the frequency synthesis device described produces the lowest channel frequency $f_o = 990,000$ kHz. In this case the two adjustable frequency dividers are adjusted according to the 48th step, i.e. the divider 4 has a division factor $N_1 = 128 + 48 = 176$ and the divider 14 has a division factor $N_2 = 436 + 48 = 484$. With this adjustment of the dividers 4 and 14 the frequency which appears at the oscillator output 2 is:

$$f_o = A \left(N_2 \cdot f_r - N_1 \frac{A-1}{A} \cdot f_r\right)$$

$$= 128 \left\{(484 \times 25) - \left(176 \times \frac{127}{128} \times 25\right)\right\} \times 990,000 \text{ kHz}.$$

On selection of channel No. 2 the two adjustable frequency dividers 4 and 14 are advanced one step, i.e. they are adjusted according to the 49th step.

The division factor of the divider then will be $N_1 = 128 + 49 = 177$ and that of the divider 14 will be $N_2 = 436 + 49 = 485$.

With this adjustment the frequency which appears at the oscillator output 2 (channel No. 2) is:

$$f_o + \Delta F = A \left(N_2 \cdot f_r - N_1 \frac{A-1}{A} \cdot f_r\right)$$

$$= 128 \left\{(485 \times 25) - \left(177 \times \frac{127}{128} \times 25\right)\right\} \times 990.025 \text{ kHz}.$$

Thus the channel frequency spacing is $$\Delta f = f_r = 25 \text{ kHz}.$$

On selection of channel No. 80 the division factors of the adjustable frequency dividers 4 and 14 are adjusted to the values $N_1 = 128 + 127 = 255$ and $N_2 = 436 + 127 = 536$, respectively.

Because the adjustable frequency dividers 4 and 14 for the purposes of restricting the loop amplification variations and of retaining the required simple realisability in practice do not permit a larger adjusting range and hence do not allow higher division factors, it would appear that at most 80 channels are selectable.

According to the further invention this problem is solved in a particularly elegant manner in that the number conversion device 21 is designed so that on selection of channel No. 81 it causes the adjustable frequency dividers 4 and 14 to be adjusted according to the 0th step and the 1st step respectively, i.e. the divider 4 has a division factor $N_1 = 128 + 0 = 128$ and the divider 14 has a division factor $N_2 = 436 + 1 = 437$.

Expressed in more general form this means that for a given number of successive channels a constant difference $D_1$ between the division factors $N_2$ and $N_1$ is used, $D_1 = N_2 - N_1$ and that for a subsequent number of successive channels another constant difference $D_2$ between the division factors $N_2$ and $N_1$ is used, which is equal to $D_2 = (N_2 + 1) - N_1$.

In the embodiment shown this means that for the channels from 1 to 80 a constant difference $D_1 = N_2 - N_1 = 436 - 128 = 308$ is used and for the channels 81 to 200 a constant difference $$D_2 = (N_2 + 1) - N_1 = 436 + 1 - 128 = 309$$

is used.

Figure 6:
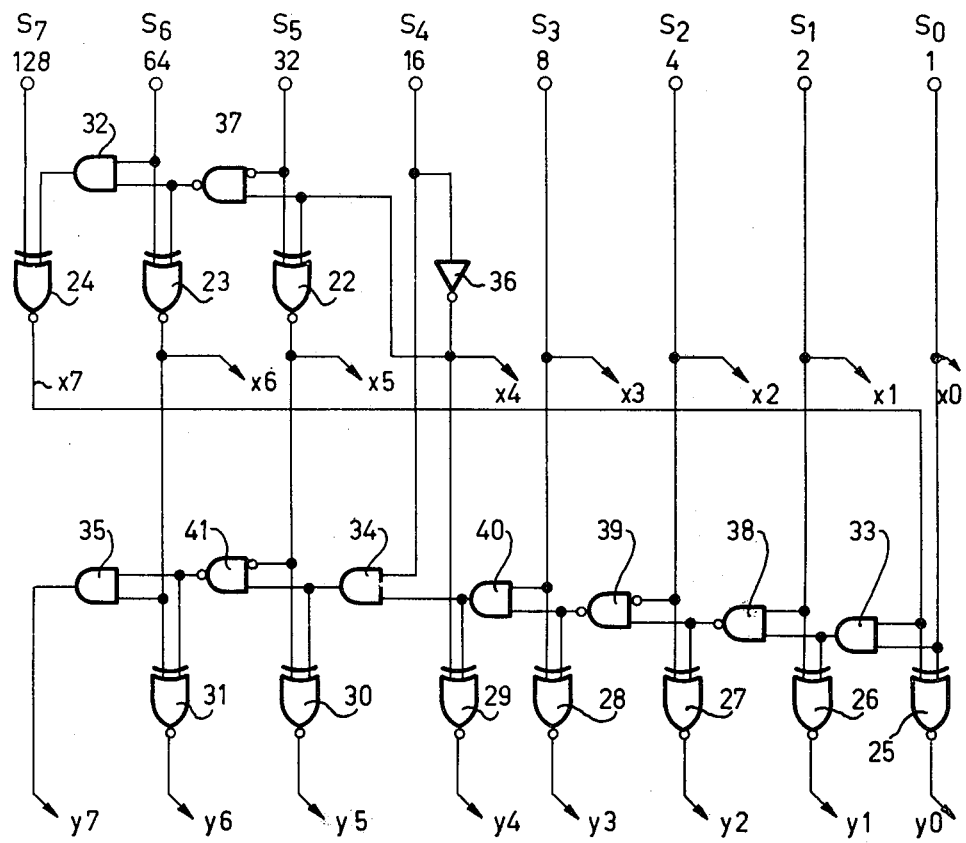
FIG. 6 shows a possible embodiment of a number conversion device as used in the embodiment of FIG. 5.

For further explanation FIG. 6 shows a possible embodiment of the number conversion device 21 as used in the frequency synthesis device of FIG. 5. This number conversion device has eight input terminals designated by the bit positions $s_0, s_1, s_2, \ldots, s_7$ of the binary number applied to these input terminals. Said number being representative of a given selected channel. The device further has seven output terminals designated by bit positions $x_0, x_1, x_2, \ldots, x_6$ of the binary number produced for adjusting the division factor $N_1$ of the adjustable frequency divider 4, and eight output terminals which are designated by bit positions $y_0, y_1, y_2, \ldots, y_7$ of the binary number produced for adjusting the division factor $N_2$ of the adjustable frequency divider 14.

The conversion of the binary number applied to the output terminals into the binary numbers requried for adjusting the dividers 4 and 14 is effected by means of ten exclusive-OR gates 22–31, four AND gates 32, 33, 34 and 35, a negator 36 and five NOT-AND gates 37–41, which elements are connected in the manner shown in the figure. Because the logical functions of these elements are generally known, the following Table will give a sufficient explanation:

trolled oscillator, a second frequency divider adjustable in incremental steps, with the frequency incremental steps of said first and second adjustable frequency dividers, being of equal step value, and a second standard frequency source connected to said second frequency adjustable circuit section, with the frequency of said second standard frequency source and the frequency of said first standard frequency source separated by a frequency value quantitatively equal to the frequency of one of said first and second standard frequency sources divided by said division factor A of said fixed frequency divider, an output signal connection for said output signal extending from said first frequency adjustable circuit section, whereby said frequency synthesizer is adjustable through a range of frequency output steps appearing at said output connection and with frequency signal output steps each uniformly equal in frequency value to the frequency used in expressing the frequency difference between said first and second standard frequency sources in response to simultaneous minimum stepping of said first and second adjustable frequency dividers.

2. Multichannel generator as claimed in claim 1, characterized in that said first and second standard

| Channel | Inputs | | | | | | | | Outputs | | | | | | | | Outputs | | | | | | | | |
|---|---|---|---|---|---|---|---|---|---|---|---|---|---|---|---|---|---|---|---|---|---|---|---|---|---|
| Nos. | $s_7$ | $s_6$ | $s_5$ | $s_4$ | $s_3$ | $s_2$ | $s_1$ | $s_0$ | $N_1$ | $x_7$ | $x_6$ | $x_5$ | $x_4$ | $x_3$ | $x_2$ | $x_1$ | $x_0$ | $N_2$ | $y_7$ | $y_6$ | $y_5$ | $y_4$ | $y_3$ | $y_2$ | $y_1$ | $y_0$ |
| 1 | 0 | 0 | 0 | 0 | 0 | 0 | 0 | 0 | 176 | 0 | 0 | 1 | 1 | 0 | 0 | 0 | 0 | 484 | 0 | 1 | 1 | 0 | 0 | 1 | 0 | 0 |
| 80 | 0 | 1 | 0 | 0 | 1 | 1 | 1 | 1 | 255 | 0 | 1 | 1 | 1 | 1 | 1 | 1 | 1 | 563 | 1 | 0 | 1 | 1 | 0 | 0 | 1 | 1 |
| 81 | 0 | 1 | 0 | 1 | 0 | 0 | 0 | 0 | 128 | 1 | 0 | 0 | 0 | 0 | 0 | 0 | 0 | 437 | 0 | 0 | 1 | 1 | 0 | 1 | 0 | 1 |
| 200 | 1 | 1 | 0 | 0 | 0 | 1 | 1 | 1 | 247 | 1 | 1 | 1 | 1 | 0 | 1 | 1 | 1 | 556 | 1 | 0 | 1 | 0 | 1 | 1 | 0 | 0 |

More particularly this Table illustrates that the constant difference between the division factors $N_2$ and $N_1$ for the channel frequencies from 1 to 80 is $D_1 = N_2 - N_1 = 308$ and for the channel frequencies from 81 to 200 is $D_2 = 309$.

What is claimed is:

1. Multichannel generator constituted by a frequency synthesizer for producing an output signal variable through a plurality of channel frequencies spaced by uniform frequency steps, said frequency synthesizer comprising a first frequency adjustable circuit section with a first voltage-controlled oscillator (VCO), a first frequency divider adjustable in incremental steps, a first frequency standard source connected to said first frequency adjustable circuit section, and a frequency translation device connected between the oscillator output and the input of said first adjustable frequency divider, characterized in that the said frequency translation device comprises a frequency divider of fixed division factor A whose input is connected to the output of the first voltage-controlled oscillator and a mixer stage included between the output of said fixed frequency divider and the input of said first adjustable frequency divider, said frequency synthesizer further comprising a second frequency adjustable circuit section for generating a transposition signal applied to the said mixer stage and including a second voltage-confrequency source are constituted by two frequency dividers of fixed division factors which are connected in parallel to a common standard frequency source.

3. Multichannel generator as claimed in claim 1, characterized in that it is provided with a channel selection device for producing a binary number which is representative of a selected channel and with a number conversion device which is composed of logic elements and to which the said binary number is supplied for generating two mutually different binary numbers which are supplied each to one of the said first and second adjustable frequency dividers for adjusting the division factors $N_1$ and $N_2$ respectively of these dividers.

4. Multichannel generator as claimed in claim 3, characterized in that the division factor ranges of the said adjustable frequency dividers are equal and smaller than the channel range and in that the number conversion device composed of logic elements ensures that for a given number of successive channels a constant difference between the division factors $N_2$ and $N_1$ is used which is equal to $D_1 = N_2 - N_1$ and in that for a subsequent number of successive channels another constant difference between the division factors $N_2$ and $N_1$ is used which is equal to $D_2 = (N_2+1) - N_1$.

* * * * *

UNITED STATES PATENT AND TRADEMARK OFFICE
CERTIFICATE OF CORRECTION

PATENT NO. : 3,956,703
DATED : May 11, 1976
INVENTOR(S) : JOHANNES NOCRDANUS ET AL

It is certified that error appears in the above—identified patent and that said Letters Patent are hereby corrected as shown below:

Column 4, line 4, change "input" to --output--;

Column 5, line 1, in the equation, change "+" to --$\pm$--;

line 10, in the equation, change "+" to --$\pm$--.

Column 6, line 33, change " x990.025 kHz" to

-- =990.025 kHz--.

Signed and Sealed this

Twenty-seventh Day of July 1976

[SEAL]

Attest:

RUTH C. MASON
*Attesting Officer*

C. MARSHALL DANN
*Commissioner of Patents and Trademarks*